US006944041B1

(12) United States Patent
Li et al.

(10) Patent No.: US 6,944,041 B1
(45) Date of Patent: Sep. 13, 2005

(54) CIRCUIT FOR ACCESSING A CHALCOGENIDE MEMORY ARRAY

(75) Inventors: Bin Li, Chantilly, VA (US); Kenneth R. Knowles, Manassas, VA (US); David C. Lawson, Haymarket, VA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 10/811,454

(22) Filed: Mar. 26, 2004

(51) Int. Cl.[7] .......................... G11C 13/00; G11C 11/00
(52) U.S. Cl. ...................................... 365/113; 365/163
(58) Field of Search ................................ 365/113, 163

(56) References Cited

U.S. PATENT DOCUMENTS

| 5,920,788 A * | 7/1999 | Reinberg ..................... 365/163 |
| 6,487,113 B1 * | 11/2002 | Park et al. ................... 365/163 |
| 6,687,153 B2 * | 2/2004 | Lowrey ....................... 365/113 |
| 6,795,338 B2 * | 9/2004 | Parkinson et al. ........... 365/163 |
| 6,813,178 B2 * | 11/2004 | Campbell et al. ........... 365/113 |

* cited by examiner

Primary Examiner—Trong Phan
(74) Attorney, Agent, or Firm—Daniel J. Long; Antony P. Ng; Dillon & Yudell LLP

(57) ABSTRACT

A circuit for accessing a chalcogenide memory array is disclosed. The chalcogenide memory array includes multiple subarrays with rows and columns formed by chalcogenide storage elements. The chalcogenide memory array is accessed by discrete read and write circuits. Associated with a respective one of the subarrays, each of the write circuits includes an independent write 0 circuit and an independent write 1 circuit. Also associated with a respective one of the subarrays, each of the read circuits includes a sense amplifier circuit. In addition, a voltage level control module is coupled to the read and write circuits to ensure that voltages across the chalcogenide storage elements within the chalcogenide memory array do not exceed a predetermined value during read and write operations.

10 Claims, 4 Drawing Sheets

US 6,944,041 B1

CIRCUIT FOR ACCESSING A CHALCOGENIDE MEMORY ARRAY

The present invention was made with Government Support under Contract (Grant) No. SC-0244-00-0002 awarded by the United States Air Force. The Government has certain rights in the present invention.

BACKGROUND OF THE INVENTION

1. Technical Field

The present invention relates to memory circuits in general, and in particular to memory circuits having chalcogenide cells. Still more particularly, the present invention relates to a circuit for accessing a chalcogenide memory array.

2. Description of Related Art

The use of electrically writable and erasable phase change materials for an electronic memory application is known in the art. Such phase change materials can be electrically switched between a first structural state where the material is generally amorphous and a second structural state where the material is generally crystalline. The phase change material exhibits different electrical characteristics depending upon its state. For example, in its amorphous state, the phase change material exhibits a lower electrical conductivity than it does in its crystalline state. The phase change material may also be electrically switched between different detectable states of local order across the entire spectrum ranging from the completely amorphous state to the completely crystalline state. In other words, the state switching of the phase change materials is not limited to either completely amorphous or completely crystalline states but rather in incremental steps to provide a "gray scale" represented by a multiplicity of conditions of local order spanning the spectrum from the completely amorphous state to the completely crystalline state.

General speaking, phase change material memory cells are monolithic, homogeneous, and formed of chalcogenide material containing chemical elements selected from the group of Tellurium (Te), Selenium (Se), Antimony (Sb), Nickel (Ni), and Germanium (Ge). Chalcogenide memory cells can be switched between two different electrically detectable states within nanoseconds in response to an input of picojoules of energy. Chalcogenide memory cells are truly non-volatile and can maintain the stored information without the need for periodic refreshing. Furthermore, the stored information remains intact even when power is removed from the chalcogenide memory cells.

The present disclosure describes a circuit for accessing a chalcogenide memory array.

SUMMARY OF THE INVENTION

In accordance with a preferred embodiment of the present invention, a random access memory includes a memory array having multiple subarrays with rows and columns formed by chalcogenide storage elements. The random access memory also includes discrete read and write circuits. Associated with a respective one of the subarrays, each of the write circuits includes an independent write 0 circuit and an independent write 1 circuit. Also associated with a respective one of the subarrays, each of the read circuits includes a sense amplifier circuit. In addition, a voltage level control module is coupled to the read and write circuits to ensure that voltages across the chalcogenide storage elements within the memory array do not exceed a predetermined value during read and write operations.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
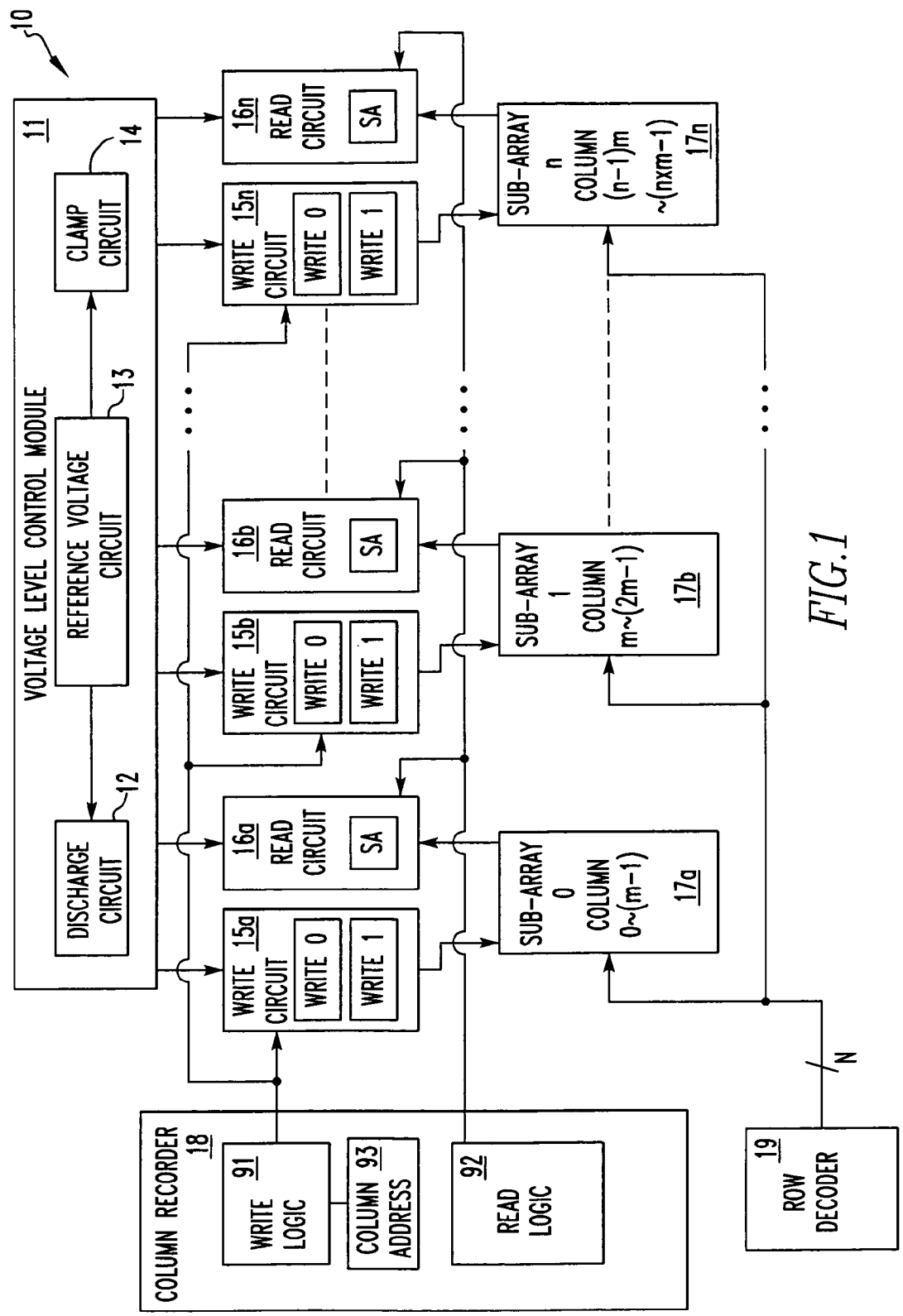
FIG. 1 is a block diagram of a chalcogenide random access memory (CRAM), in accordance with a preferred embodiment of the present invention.

Referring now to the drawings and in particular to FIG. 1, there is illustrated a block diagram of a chalcogenide random access memory (CRAM), in accordance with a preferred embodiment of the present invention. As shown, a CRAM 10 includes write circuits 15a–15n, read circuits 16a–16n, and memory subarrays 17a–17n. Each of memory subarrays 17a–17n is associated with a separate write circuit and a separate read circuit. For example, memory subarray 17a is associated with write circuit 15a and read circuit 16a, memory subarray 17b is associated with write circuit 15b and read circuit 16b, memory subarray 17n is associated with write circuit 15n and read circuit 16n, etc. Write circuits 15a–15n and read circuits 16a–16n are collectively controlled by a voltage level control module 11.

Voltage level control module 11 includes a post-write discharge circuit 12, a read voltage clamp circuit 14 and a reference voltage circuit 13. Reference voltage circuit 13 provides a constant reference voltage for post-write discharge circuit 12 and read voltage clamp circuit 14. In addition, the reference voltage generated by reference voltage circuit 13 is preferably selected to optimize the clamping voltage generated by read voltage clamp circuit 14 in accordance with the processing technology for CRAM 10.

CRAM 10 also includes a column decoder 18 and a row decoder 19. Column decoder 18 further contains a write logic circuit 91, a read logic circuit 92 and a column address circuit 93. During a write operation, write logic circuit 91 provides a column address to corresponding write circuits 15a–15n such that data can be written to an appropriate column within one of subarrays 17a–17n. During a read operation, read logic circuit 92 provides a column address to corresponding read circuits 16a–16n such that data can be read from an appropriate column within one of subarrays 17a–17n. In conjunction with the column addresses from column decoder 18, row decoder 19 provides row addresses for the appropriate memory cell within subarrays 17a–17n during read and write operations.

CRAM 10 can be coupled to an electronic device (not shown) such as a processor, a memory controller, a chip set, etc. The electronic device is preferably coupled to column decoder 18 and row decoder 19 via respective address lines. The electronic device is also coupled to voltage level control module 11 via various control lines. In addition, the electronic device is coupled to an input/output circuit of CRAM 10 via corresponding input/output lines.

Each of write circuits 15a–15n includes a write 0 circuit and a write 1 circuit. As their names imply, a write 0 circuit is utilized to write a logical "0" to a memory cell within a corresponding one of subarrays 17a–17n, and a write 1 circuit is utilized to write a logical "1" to a memory cell within a corresponding one of subarrays 17a–17n. Each of read circuits 16a–16n includes a sense amplifier circuit. Each of subarrays 17a–17n are arranged in columns and rows. Along the sense amplifier circuits, subarrays 17a–17n are constructed to use a memory cell sensing scheme such that each column is to be used in reading data from a memory cell within a corresponding one of subarrays 17a–17n.

In FIG. 1, CRAM 10 is shown to have a single memory array having multiple subarrays, such as subarrays 17a–17n. However, a CRAM may have multiple memory arrays and each of the memory arrays may include multiple subarrays. Although a CRAM only needs one row multiplexor and one column multiplexor, each memory array within a CRAM preferably includes one reference voltage circuit, such as reference voltage circuit 13. In addition, each subarray is preferably associated with one write 0 circuit, one write 1 circuit and one read circuit.

Figure 2:
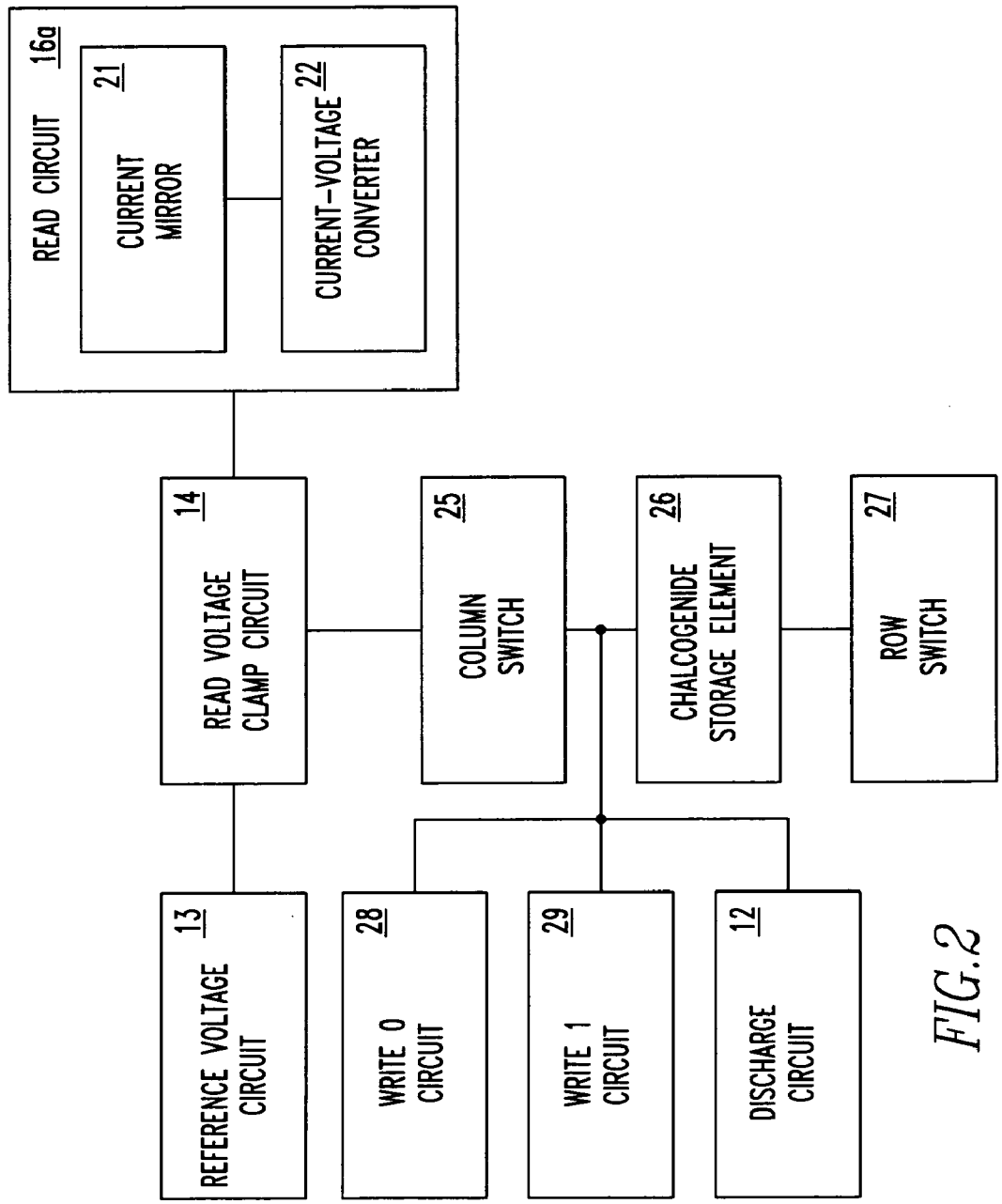
FIG. 2 is a block diagram of a column within one of the subarrays within the CRAM from FIG. 1, in accordance with a preferred embodiment of the present invention.

With reference now to FIG. 2, there is depicted a block diagram of a column within one of subarrays 17a–17n from FIG. 1, in accordance with a preferred embodiment of the present invention. Each column within subarrays 17a–17n includes multiple memory cells, and each memory cell is comprised of a storage element made of chalcogenide materials. Chalcogenide materials are chemical elements selected from the group of Tellurium (Te), Selenium (Se), Antimony (Sb) and Germanium (Ge). As shown, a chalcogenide storage element 26 is coupled to a column switch 25 and a row switch 27. Row switch 25 and column switch 27 are part of a row multiplexor and a column multiplexor, respectively.

During a write operation, chalcogenide storage element 26 is accessed by either a write 0 circuit 28 or a write 1 circuit 29, and then by post-write discharge circuit 12. During a read operation, chalcogenide storage element 26 is accessed by read circuit 16a via read voltage clamp circuit 14. The reference voltage for read voltage clamp circuit 14 is provided by reference voltage circuit 13. For the present embodiment, read circuit 16a includes a current mirror 21 and a current-voltage converter 22.

The use of chalcogenide material in a binary mode memory cell requires separate write 0 and write 1 circuits, such as write 0 circuit 28 and write 1 circuit 29, to provide different temperature (energy) profiles based on whether a logical "0" or "1" is to be stored. Each of write circuits 28 and 29 tailors a pulse width to account for the differences in programming time according to the data value needed to be stored in the memory cell. The amount of energy imparted to chalcogenide storage element 26 varies, depending on the desired polycrystalline or amorphous retention state. Upon the receipt of input data, either write 0 circuit 28 or write 1 circuit 29 provides an appropriate amount of current flow to chalcogenide storage element 26. Additional control can be provided through independent bias points that sufficiently modulate write circuits 28 and 29 from an external source.

Figure 3:
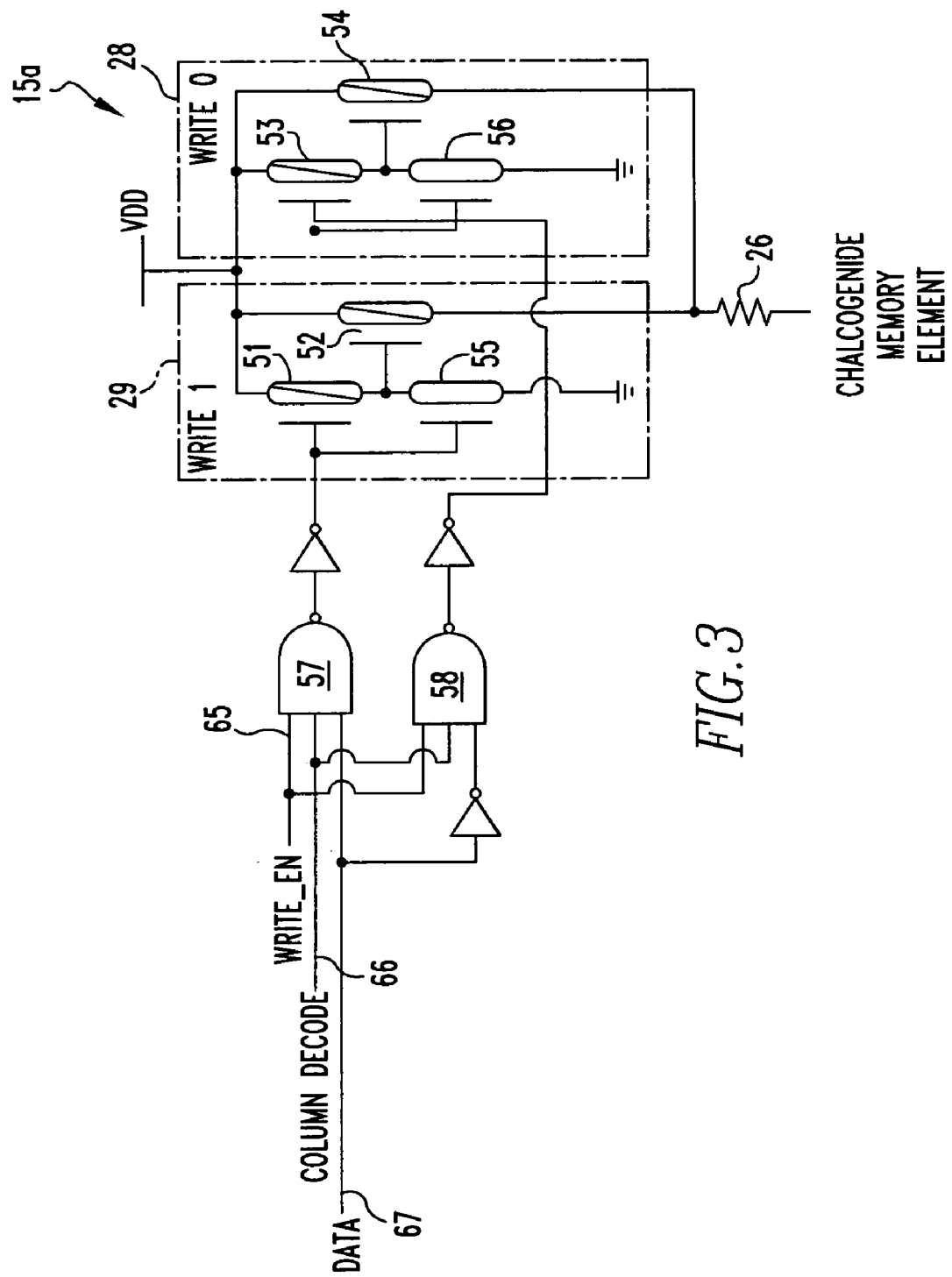
FIG. 3 is a circuit diagram of a write 0 circuit and a write 1 circuit within the CRAM from FIG. 1, in accordance with a preferred embodiment of the present invention.

Referring now to FIG. 3, there is depicted a circuit diagram of a write circuit, in accordance with a preferred embodiment of the present invention. As shown, write circuit 15a includes write 0 circuit 28 and write 1 circuit 29. Write 0 circuit 28 includes p-channel transistors 51–52 and n-channel transistor 55. Write 1 circuit 29 includes p-channel transistors 53–54 and n-channel transistor 56. Transistors 51 and 55 are connected in series between power supply $V_{DD}$ and ground. Similarly, transistors 53 and 56 are connected in series between power supply $V_{DD}$ and ground. Transistors 52 and 54 are separately connected between power supply $V_{DD}$ and chalcogenide memory element 26. The gate of transistor 52 is connected to the node between transistors 51 and 55. The gate of transistor 54 is connected to the node between transistors 53 and 56.

Inputs to write circuit 15a include write enable input 65, column decode input 66 and data input 67. An NAND gate 57 combines a write enable signal at write enable input 65, a column decode signal at column decode input 66 and a data signal at data input 67 to feed the gates of transistors 51 and 55. Similarly, an NAND gate 58 combines a write enable signal at write enable input 65, a column decode signal at column decode input 66 and a data signal at data input 67 to feed the gates of transistors 53 and 56.

Transistor 54 is the write transistor for write 0 circuit 28, and transistor 52 is the write transistor for write 1 circuit 29. For the present embodiment, the size of transistor 54 is preferably larger than the size of transistor 52 such that more current can be provided to chalcogenide memory element 26 for a write 0 operation. Incidentally, relatively less current is provided to chalcogenide memory element 26 by transistor 52 for a write 1 operation. Specifically, when the data signal at data input 67 is a logical "0" during a write operation, transistor 54 within write 0 circuit 28 is turned on to allow a first predetermined amount of current to program chalcogenide memory element 26 to store a logical "0." When the data signal at data input 67 is a logical "1" during a write operation, transistor 52 within write 1 circuit 29 is turned on to allow a second predetermined amount of current to program chalcogenide memory element 26 to store a logical "1."

Figure 4:
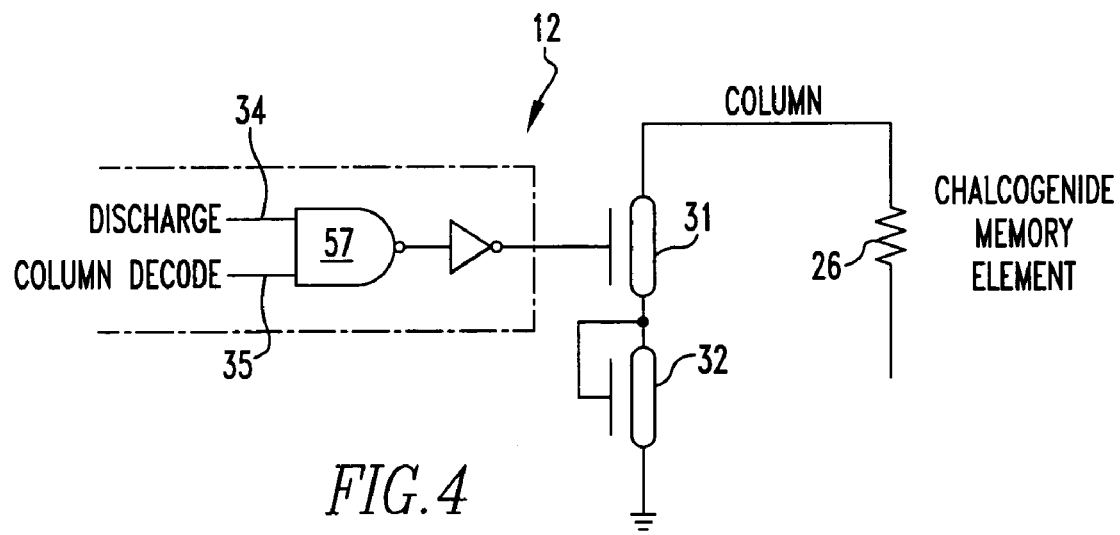
FIG. 4 is a circuit diagram of a post-write discharge circuit within the CRAM from FIG. 1, in accordance with a preferred embodiment of the present invention.

Post-write discharge circuit 12 (from FIG. 1) is specifically designed to lower the voltage on a previously written column to prevent any reprogramming of a chalcogenide storage element within the same column on subsequent read operations. With reference now to FIG. 4, there is illustrated a circuit diagram of post-write discharge circuit 12, in accordance with a preferred embodiment of the present invention. As shown, post-write discharge circuit 12 includes an n-channel transistor 31 and an n-channel transistor 32 connected in series. The drain of transistor 31 is connected to chalcogenide memory element 26. The source of transistor 31 is connected to the drain of transistor 32. The drain of transistor 32 is also connected the gate of transistor 32 to form a diode. The source of transistor 32 is connected to the ground. With the diode configuration of transistor 32, voltage developed across chalcogenide memory element 26 is reduced to ground plus $V_{xy}$ as the write cycle terminates. Discharging the node between transistors 31 and 32 prevents any possible reprogramming of chalcogenide memory element 26 on subsequent read operations. A discharge signal at a discharge signal input 34 and a column decode signal at a column decode signal input 35 enable transistor 31 to be connected to chalcogenide memory element 26 and also enable transistor 31 to be in series with transistor 32 connected to ground.

Figure 5:
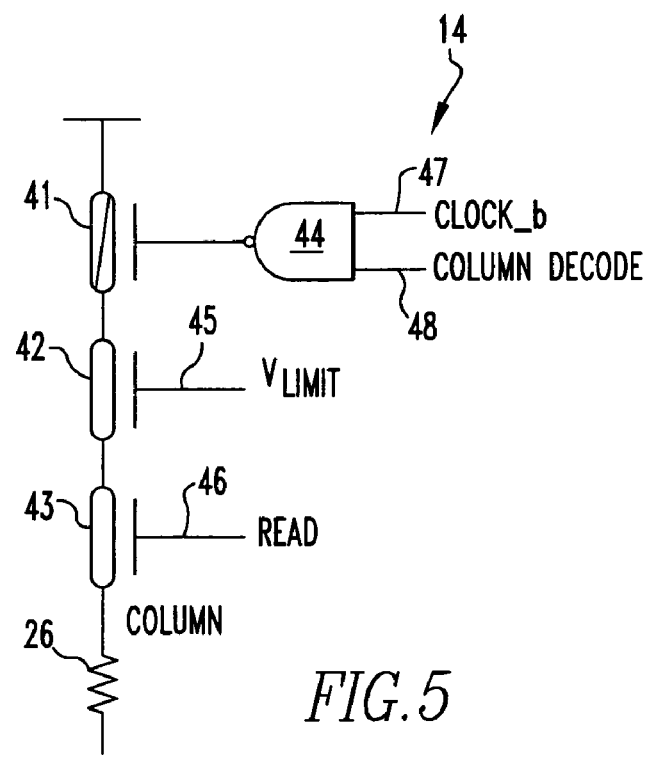
FIG. 5 is a circuit diagram of a read voltage clamp circuit within the CRAM from FIG. 1, in accordance with a preferred embodiment of the present invention.

Read voltage clamp circuit 14 (from FIG. 1) establishes an acceptable voltage limit across chalcogenide memory element 26 to prevent the parasitic effects of stored charges on a column from influencing the information stored in chalcogenide memory element 26. If the column discharges to ground (below the limit set by discharge circuit 12), read voltage clamp circuit 24 also restores the voltage of the column to the acceptable voltage. Referring now to FIG. 5, there is depicted a circuit diagram of read voltage clamp circuit 14, in accordance with a preferred embodiment of the present invention. As shown, read voltage clamp circuit 24 includes a p-channel transistor 41 and two n-channel transistors 42–43 connected in series. The drain of transistor 41 is connected to a power supply $V_{DD}$. The source of transistor 43 is connected to chalcogenide memory element 26. The gate of transistor 41 is connected to an NAND gate 44 having a negative clock signal input 47 and a column decode input 48. The gate of transistor 42 is connected to a voltage limit signal input 45. The gate of transistor 43 is connected to a read signal input 46. A voltage limit signal from voltage limit signal input 45 modulates the acceptable voltage during the negative clock cycle.

As has been described, the present invention provides a circuit for accessing a chalcogenide memory array. Although only one chalcogenide storage element is utilized to illustrate the present invention, it is understood by those skilled in the art that two chalcogenide storage elements can be associated with a logical data bit by utilizing a double-ended or "differential" version of the above-described single-ended circuit. The doubled-end circuit is similar to the above-described single-ended circuit except that there is a complementary data input with its own read and write circuits to store the complement of each input data bit in a chalcogenide storage element, and a differential amplifier circuit is utilized to sense the complementary data bits stored. The differential design of the true-and-complement value of each logical data bit provides a higher noise margin and thus provides a greater reliability for each data bit stored in case of a defect exists in the input signals or the chalcogenide memory chip.

While the invention has been particularly shown and described with reference to a preferred embodiment, it will be understood by those skilled in the art that various changes in form and detail may be made therein without departing from the spirit and scope of the invention.

What is claimed is:

1. A random access memory comprising:
    a memory array having a plurality of subarrays formed by chalcogenide storage elements;
    a plurality of write circuits, wherein each of said plurality of write circuits includes an independent write 0 circuit and an independent write 1 circuit, wherein each of said plurality of write circuits is associated with a respective one of said plurality of subarrays;
    a plurality of read circuits, wherein each of said plurality of read circuits includes a sense amplifier circuit, wherein each of said plurality of read circuits is associated with a respective one of said plurality of subarrays;
    a voltage level control module, coupled to said plurality of read and write circuits, for ensuring that voltages across said chalcogenide storage elements do not exceed a predetermined value during a read or write operation such that data values stored within said chalcogenide storage elements cannot be changed erroneously and that the life of said chalcogenide storage elements can be extended.

2. The random access memory of claim 1, wherein said write 0 circuit includes an inverter and a write 0 transistor.

3. The random access memory of claim 2, wherein said write 1 circuit includes an inverter and a write 1 transistor.

4. The random access memory of claim 3, wherein write 0 transistor is larger than said write 1 transistor.

5. The random access memory of claim 1, wherein said voltage level control module further includes a post-write discharge circuit for lowering the voltage on a column that has been previously written in order to prevent any reprogramming of a chalcogenide storage element within said previously written column on subsequent read operations.

6. The random access memory of claim 5, wherein said post-write discharge circuit includes a diode for discharging excess current to ground.

7. The random access memory of claim 5, wherein said voltage level control module further includes a read voltage clamp circuit for establishing an acceptable voltage limit across a chalcogenide memory element to prevent parasitic effects of stored charges on a column from influencing the information stored in said chalcogenide memory element.

8. The random access memory of claim 7, wherein said voltage level control module further includes a reference voltage circuit to provide a reference voltage for said read voltage clamp circuit and said post-write discharge circuit.

9. The random access memory of claim 1, wherein said chalcogenide storage elements are made of chemical elements selected from a group of tellurium, selenium, antimony and germanium.

10. The random access memory of claim 1, wherein said random access memory further includes a column decoder and a row decoder.

\* \* \* \* \*

UNITED STATES PATENT AND TRADEMARK OFFICE
CERTIFICATE OF CORRECTION

PATENT NO. : 6,944,041 B1 Page 1 of 1
DATED : September 13, 2005
INVENTOR(S) : Li et al.

It is certified that error appears in the above-identified patent and that said Letters Patent is hereby corrected as shown below:

<u>Title page,</u>
Item [73], Assignee, should read -- BAE Systems Information and Electronic Systems Integration Inc. --.

Signed and Sealed this

Second Day of May, 2006

JON W. DUDAS
*Director of the United States Patent and Trademark Office*